(12) United States Patent
Jo et al.

(10) Patent No.: US 10,614,880 B2
(45) Date of Patent: Apr. 7, 2020

(54) MEMORY SYSTEM FOR CONTROLLING READ VOLTAGE USING CACHED DATA AND OPERATION METHOD OF THE SAME

(71) Applicant: SK hynix Inc., Gyeonggi-do (KR)

(72) Inventors: Sang-Gu Jo, Gyeonggi-do (KR);
Jung-Hyun Kwon, Seoul (KR);
Sung-Eun Lee, Gyeonggi-do (KR);
Yong-Ju Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/831,979

(22) Filed: Dec. 5, 2017

(65) Prior Publication Data
US 2018/0240516 A1  Aug. 23, 2018

(30) Foreign Application Priority Data
Feb. 20, 2017  (KR) .......................... 10-2017-0022235

(51) Int. Cl.
| | |
|---|---|
| *G11C 16/04* | (2006.01) |
| *G11C 11/56* | (2006.01) |
| *G11C 16/26* | (2006.01) |
| *G11C 16/34* | (2006.01) |
| *G06F 3/06* | (2006.01) |
| *G11C 7/22* | (2006.01) |
| *G06F 13/16* | (2006.01) |
| *G11C 13/00* | (2006.01) |

(52) U.S. Cl.
CPC ........ *G11C 11/5642* (2013.01); *G06F 3/0679* (2013.01); *G06F 13/1626* (2013.01); *G11C 7/22* (2013.01); *G11C 13/0004* (2013.01); *G11C 13/004* (2013.01); *G11C 16/0483* (2013.01); *G11C 16/26* (2013.01); *G11C 16/3404* (2013.01); *G11C 2013/005* (2013.01); *G11C 2207/2245* (2013.01); *G11C 2207/2254* (2013.01)

(58) Field of Classification Search
CPC ... G11C 11/5642; G11C 16/0483; G11C 7/22; G11C 16/3404; G11C 16/26; G06F 13/1626; G06F 3/0679
USPC .................................................. 365/185.03
See application file for complete search history.

(56) References Cited

U.S. PATENT DOCUMENTS

| | | | | |
|---|---|---|---|---|
| 8,429,498 | B1 * | 4/2013 | Anholt ................ | G06F 11/1048 365/227 |
| 2013/0080858 | A1 * | 3/2013 | Lee ......................... | G11C 16/26 714/773 |
| 2014/0029338 | A1 * | 1/2014 | Shalvi ................ | G11C 11/5628 365/185.03 |
| 2015/0029796 | A1 | 1/2015 | Choi et al. | |

FOREIGN PATENT DOCUMENTS

KR  1020150046549  4/2015

* cited by examiner

*Primary Examiner* — Tha-O H Bui
(74) *Attorney, Agent, or Firm* — IP & T Group LLP

(57) ABSTRACT

A memory system includes: a memory device; a cache memory suitable for caching a portion of a data stored in the memory device; and a read voltage controller suitable for controlling a level of a read voltage of the memory device by comparing a cache data in the cache memory with a data from the memory device corresponding to the cache data.

14 Claims, 6 Drawing Sheets

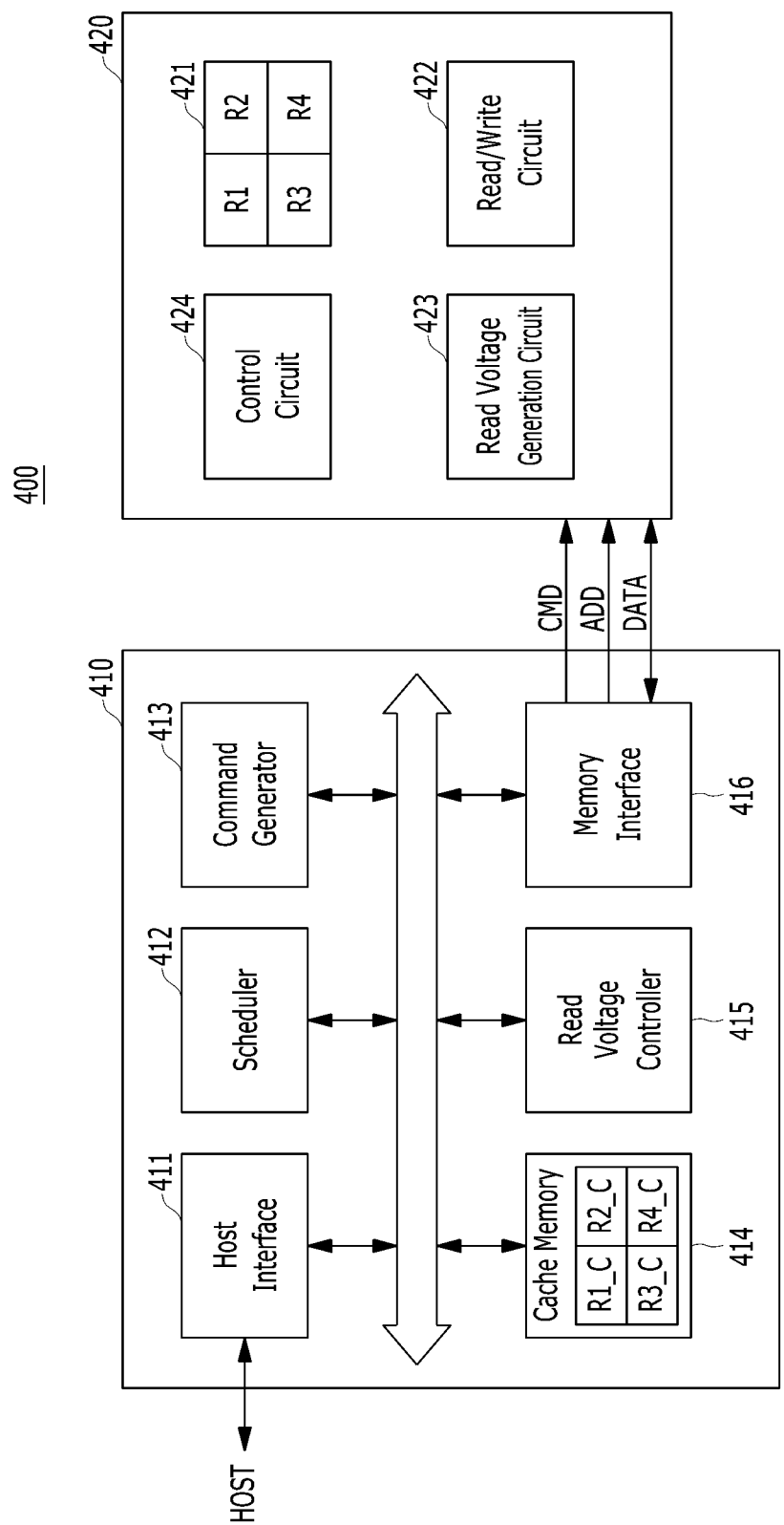

MEMORY SYSTEM FOR CONTROLLING READ VOLTAGE USING CACHED DATA AND OPERATION METHOD OF THE SAME

CROSS-REFERENCE TO RELATED APPLICATIONS

The present application claims priority of Korean Patent Application No. 10-2017-0022235, filed on Feb. 20, 2017, which is herein incorporated by reference in its entirety.

BACKGROUND

1. Field

Exemplary embodiments of the present disclosure relate to a memory system.

2. Description of the Related Art

Recently, researchers and the industry develop the next-generation memory devices for replacing Dynamic Random Access Memories (DRAM) and flash memories. Among the next-generation memory devices is a resistive memory device using a variable resistance material, which is a material capable of switching between two different resistance states as the resistance level of the variable resistance material is quickly changed according to a bias applied there to. Representative examples of the resistive memory device may include a Phase-Change Random Access Memory (PCRAM), a Resistive Random Access Memory (RRAM), a Magnetic Random Access Memory (MRAM), a Ferroelectric Random Access Memory (FRAM) and the like.

The resistive memory device has been developed as a non-volatile memory device, but the data stored therein may be lost due to the occurrence of a drift phenomenon in which the resistance value is changed as time passes since data are written in the memory cells of the resistive memory device.

SUMMARY

Embodiments of the present disclosure are directed to a technology for controlling a read voltage used for a read operation of a memory device into an optimal value.

In accordance with an embodiment of the present invention, a memory system includes: a memory device; a cache memory suitable for caching a portion of a data stored in the memory device; and a read voltage controller suitable for controlling a level of a read voltage of the memory device by comparing a cache data in the cache memory with a data from the memory device corresponding to the cache data.

The read voltage controller may control the level of the read voltage based on the number of different bits between the cache data and the data.

The read voltage controller may control the level of the read voltage in such a manner that the number of the different bits is decreased.

The memory device may include a plurality of regions, and the cache memory caches a portion of a data of each of the plurality of the regions, and the read voltage controller controls the level of the read voltage for each of the plurality of the regions.

The cache memory and the read voltage controller may be included in a memory controller.

The memory controller may include: a host interface suitable for communicating with a host; a scheduler suitable for deciding a process order of requests transferred from the host; a command generator suitable for generating a command to be applied to the memory device; and a memory interface suitable for communicating with the memory device.

In accordance with another embodiment of the present invention, a method for operating a memory system includes: reading a cached data from a cache memory; reading a data corresponding to the cached data from a memory device; comparing the cached data with the data; and determining a level of a read voltage of the memory device based on the comparison result.

The determining of the level of the read voltage of the memory device based on the comparison result may include: determining whether or not the number of different bits between the cached data and the data is equal to or greater than a threshold value; and when it is determined that the number of the different bits between the cached data and the data is equal to or greater than the threshold value, controlling the level of the read voltage.

In the controlling of the level of the read voltage, the number of the different bits may be made to be smaller than the threshold value by increasing or decreasing the level of the read voltage.

The controlling of the level of the read voltage may include: increasing the level of the read voltage; re-reading the data from the memory device by using the read voltage whose level is increased; re-checking whether or not the number of the different bits is less than the threshold value; and when the number of the different bits is equal to or greater than the threshold value, repeatedly performing the increasing of the level of the read voltage, the re-reading of the data, and the re-checking of whether or not the number of the different bits is less than the threshold value.

The controlling of the level of the read voltage may include: decreasing the level of the read voltage; re-reading the data by using the read voltage level which is decreased; re-checking whether or not the number of the different bits is less than the threshold value; and when the number of the different bits is equal to or greater than the threshold value, repeatedly performing the decreasing of the level of the read voltage, the re-reading of the data corresponding to the cached data from the memory device, and the re-checking of whether or not the number of the different bits is less than the threshold value.

The controlling of the level of the read voltage may include: increasing the level of the read voltage; re-reading the data corresponding to the cached data from the memory device by using the read voltage level which is increased; checking whether or not the number of the different bits is decreased; and when the number of the different bits is decreased, increasing the level of the read voltage until the number of the different bits becomes less than the threshold value.

The controlling of the level of the read voltage may include: decreasing the level of the read voltage; re-reading the data by using the read voltage level which is decreased; checking whether or not the number of the different bits is decreased; and when the number of the different bits is decreased, decreasing the level of the read voltage until the number of the different bits becomes less than the threshold value.

BRIEF DESCRIPTION OF THE DRAWINGS

FIG. 4 is a block diagram illustrating a memory system in accordance with an embodiment of the present invention.

DETAILED DESCRIPTION

Figure 1:
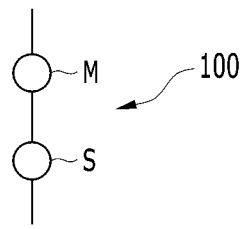
FIG. 1 illustrates a resistive memory cell of a resistive memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
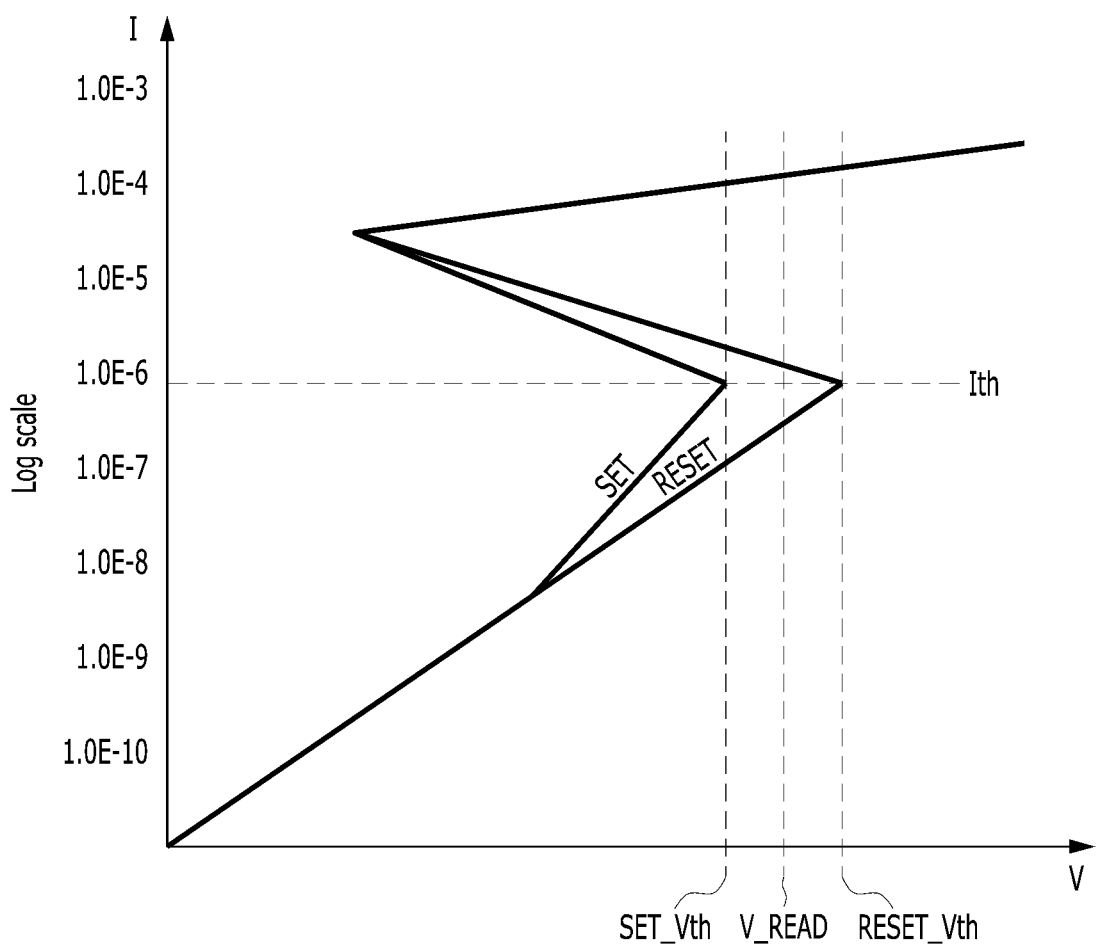
FIG. 2 is a graph illustrating an I-V curve of a resistive memory cell.

FIG. 1 illustrates a resistive memory cell 100 of a resistive memory device. FIG. 2 is a graph illustrating an I-V curve of a resistive memory cell, for example, the resistive memory cell 100.

Referring to FIG. 1, the resistive memory cell 100 may include a resistive memory element M and a selection element S.

The resistive memory element M may be in a low resistance state which is called a 'set' state or a high resistance state which is called a 'reset' state based on a data that is stored therein. The resistive memory element M may be a phase-change memory device, and when the resistive memory element M is in a crystalline state, the resistive memory element M may have a low resistance value. When the resistive memory element M is in an amorphous state, the resistive memory element M may have a high resistance value.

When the selection element S is turned off, a slight amount of current flows. When the amount of current flowing through a memory cell exceeds a threshold value Ith, the selection element S is turned on. When the selection element S is turned on, more current may flow than before the selection element S is turned on. After the selection element S is turned on, a snapback phenomenon where the voltage levels at both ends of the memory cell 100 are drastically reduced may occur. The selection element S may be an ovonic threshold switch (OTS) device.

FIG. 2 is a graph illustrating the current flowing through a resistive memory cell, for example, the memory cell 100 of FIG. 1 according to the voltage that is applied to both ends of the memory cell 100. Whether the memory cell 100 is in a high resistance state (RESET) or in a low resistance state (SET), as the level of the voltage applied to both ends of the memory cell 100 is increased, the amount of current flowing through a memory cell may be increased. When the voltage level is the same, more current may flow through a memory cell of a low resistance state (SET) than through a memory cell of a high resistance state (RESET).

When a voltage at both ends of a memory cell which is in a low resistance state (SET) reaches a threshold value SET_Vth of the low resistance state (SET), that is, when the amount of current flowing through the memory cell in a low resistance state (SET) reaches a threshold value Ith, the selection element S of the memory cell 100 in the low resistance state (SET) may be turned on and the voltage level at both ends of the memory cell is drastically reduced while the amount of current flowing through the memory cell is remarkably increased, which is called a snapback phenomenon.

When a voltage at both ends of a memory cell which is in a high resistance state (RESET) reaches a threshold value RESET_Vth of the high resistance state (RESET), that is, when the amount of current flowing through the memory cell 100 in a high resistance state (RESET) reaches a threshold value Ith, the selection element S of the memory cell 100 in the high resistance state (RESET) may be turned on and the voltage level at both ends of the memory cell 100 is drastically reduced while the amount of current flowing through the memory cell 100 is remarkably increased, which is called a snapback phenomenon.

The data stored in the memory cell 100 may be read by taking advantage of the snapback phenomenon. When a read voltage V_READ which is greater than the threshold value SET_Vth of the low resistance state (SET) and less than the threshold value RESET_Vth of the high resistance state (RESET) is applied to both ends of the memory cell 100 and the memory cell 100 is in a low resistance state, the snapback phenomenon may occur in the memory cell 100 and a large amount of current may flow through the memory cell 100. When a read voltage V_READ which is greater than the threshold value SET_Vth of the low resistance state (SET) and less than the threshold value RESET_Vth of the high resistance state (RESET) is applied to both ends of the memory cell 100 but the memory cell 100 is in a high resistance state, the snapback phenomenon may not occur in the memory cell 100 and thus a small amount of current may flow through the memory cell 100. Therefore, it is possible to detect whether the memory cell 100 is in a low resistance state or a high resistance state by applying the read voltage V_READ to both ends of the memory cell 100 and sensing the amount of current flowing through the memory cell 100.

A data may be written that is, programmed in the memory cell 100 by applying a write current to the memory cell 100 to turn the state of the resistive memory element M of the memory cell 100 into a melting state. If the write current is decreased gradually after turning the state of the resistive memory element M of the memory cell 100 into a melting state, the resistive memory element M may become a crystalline state, which is a low resistance state. If the write current is decreased quickly after turning the state of the resistive memory element M of the memory cell 100 into a melting state, the resistive memory element M may become an amorphous state, which is a high resistance state.

The resistance value of the resistive memory element M of the memory cell 100 may be changed as time passes due to a drift phenomenon. Also, it is known that the resistance value of the selection element S of the memory cell 100 may be changed as time passes due to the drift phenomenon as well. In short, the data stored in the memory cell 100 may be lost due to the drift phenomenon.

Figure 3A:
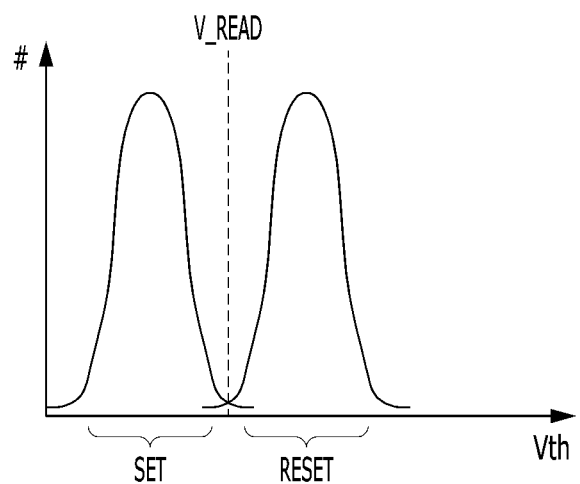
FIGS. 3A and 3B are graphs showing threshold voltage distribution of memory cells in the inside of a resistive memory device.
Figure 3B:
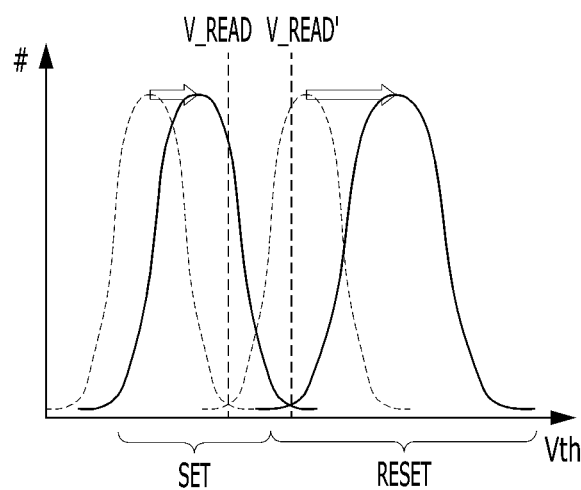

FIGS. 3A and 3B are graphs showing threshold voltage distribution of memory cells in the inside of a resistive memory device.

FIG. 3A is a graph showing threshold voltage distribution of the memory cells right after data are written in the memory cells. Herein, the X axis may represent a threshold voltage Vth, and the Y axis may represent the number of the memory cells #. When the threshold voltage distribution of the memory cells is as shown in FIG. 3A, memory cells in a set state SET and memory cells in a reset state RESET may be distinguished from each other based on a read voltage V_READ.

FIG. 3B shows the memory cells after the drift phenomenon occurs as time passes from the state of FIG. 3A. Referring to FIG. 3B, it may be seen that the threshold voltages of both memory cells in the set state SET and memory cells in the reset state RESET are all increased. When the drift phenomenon occurs, a greater read voltage V_READ' than the read voltage V_READ may have to be used to distinguish the memory cells in the set state SET and the memory cells in the reset state RESET from each other. Since a drift value is not a uniform value, although the drift value tends to increase as time passes, it is difficult to adjust the read voltage V_READ' appropriately. When a large amount of drift occurs, the data stored in the memory cells may be lost.

FIG. 4 is a block diagram illustrating a memory system 400 in accordance with an embodiment of the present invention.

Referring to FIG. 4, the memory system 400 may include a memory controller 410 and a memory device 420.

The memory controller 410 may control the operation of the memory device 420 according to a request from a host. The host may be a central processing unit (CPU), a graphic processing Unit (GPU), or an application processor (AP). The memory controller 410 may include a host interface 411, a scheduler 412, a command generator 413, a cache memory 414, a read voltage controller 415, and a memory interface 416.

The host interface 411 may be an interface between the memory controller 410 and the host. The requests from the host may be received through the host interface 411, and also the results of the operations corresponding to the requests may be transferred to the host through the host interface 411.

The scheduler 412 may determine the order of the requests to be applied to the memory device 420 among the requests from the host. The scheduler 412 may determine the order of receiving the requests from the host and the order of the operations to be directed to the memory device 420 differently in order to improve the performance of the memory device 420. For example, although the hosts requests, for the memory device 420, a read operation first and then requests a write operation, the scheduler 412 may control the order in such a manner that the write operation is performed prior to the read operation.

The command generator 413 may generate commands to be applied to the memory device 420 in conformity to the order that is determined by the scheduler 412.

The cache memory 414 may cache a portion of the data stored in the memory device 420. The cache memory 414 may include a plurality of regions R1_C to R4_C. Each of the regions R1_C to R4_C of the cache memory 414 may cache a portion of the data of the corresponding region among a plurality of regions R1 to R4 of the memory device 420. For example, the region R2_C of the cache memory 414 may cache the data that are frequently accessed among the data of the region R2 of the memory device 420. Also, the region R4_C of the cache memory 414 may cache the data that are frequently accessed among the data of the region R4 of the memory device 420. When the data requested by the host to the memory controller 410 is cached in the cache memory 414, the memory device 420 which is relatively fast may be accessed instead of the memory device 420 which is relatively slow in order to increase the operation speed of the memory system 400.

The read voltage controller 415 may control the level of a read voltage VREAD that is used for a read operation of the memory device 420. The read voltage controller 415 may be able to control the level of a read voltage VREAD by comparing the data that are cached in the cache memory 414 with the data that are read from the memory device 420. The read voltage controller 415 may individually control the levels of the read voltages VREAD1 to VREAD4 to be used for the regions R1 to R4 of the memory device 420, respectively. For example, the read voltage controller 415 may control the level of the read voltage VREAD1 that is used when data are read from the region R1 by comparing the data cached in the region R1_C of the cache memory 414 with the data stored in the region R1 of the memory device 420, and control the level of a read voltage VREAD3 by comparing the data cached in the region R3_C of the cache memory 414 with the data stored in a region R3 of the memory device 420. The operation of the read voltage controller 415 will be described later with reference to FIGS. 5 to 8.

The memory interface 416 may be an interface between the memory controller 410 and the memory device 420. A command CMD and an address ADD may be transferred or transmitted from the memory controller 410 to the memory device 420 through the memory interface 416, and data may be transmitted/received between the memory controller 410 and the memory device 420 through the memory interface 416.

The memory device 420 may perform an operation such as a read operation and a write operation under the control of the memory controller 410. Also, the levels of the read voltages VREAD1 to VREAD4 that are used in the memory device 420 may be decided by the memory controller 410. The memory device 420 may include a cell array 421, a read/write circuit 422, a read voltage generation circuit 423, and a control circuit 424. The memory device 420 may be a resistive memory device described above with reference to FIGS. 1 to 3, but the scope and spirit of the present invention are not limited to it. The memory device 420 may be one among all kinds of memory devices that uses a read voltage for a read operation, in other words, a memory device using a read voltage to determine a data.

The cell array 421 may include a plurality of memory cells. The cell array 421 may be divided into the plurality of regions R1 to R4. The read/write circuit 422 may be able to write a data in a memory cell that is selected based on an address ADD among the memory cells of the cell array 421, or read a data from the selected memory cell among the memory cells of the cell array 421 based on an address ADD. During a read operation, read voltages VREAD1 to VREAD4 may be used for the regions R1 to R4 of the cell array 421, respectively, to determine a data. The read/write circuit 422 may receive a data DATA to be written in the cell array 421 from the memory controller 410 during a write operation, and transmit a read data from the cell array 421 to the memory controller 410 during a read operation. The read voltage generation circuit 423 may generate the read voltages VREAD1 to VREAD4 to be used for a read operation. The levels of the read voltages VREAD1 to VREAD4 that are generated by the read voltage generation circuit 423 may be set up by the memory controller 410. The control circuit 424 may control the cell array 421, the read/write circuit 422 and the read voltage generation circuit 423 so that a read operation, a write operation, or a setup operation that is directed by a command CMD received from the memory controller 410 may be performed.

Although FIG. 4 shows an example in which the cache memory 414 and the read voltage controller 415 are included in the memory controller 410, this is not only one example and it is obvious to those skilled in the art that more than one among the cache memory 414 and the read voltage controller 415 may be disposed in the outside of the memory controller 410.

Figure 5:
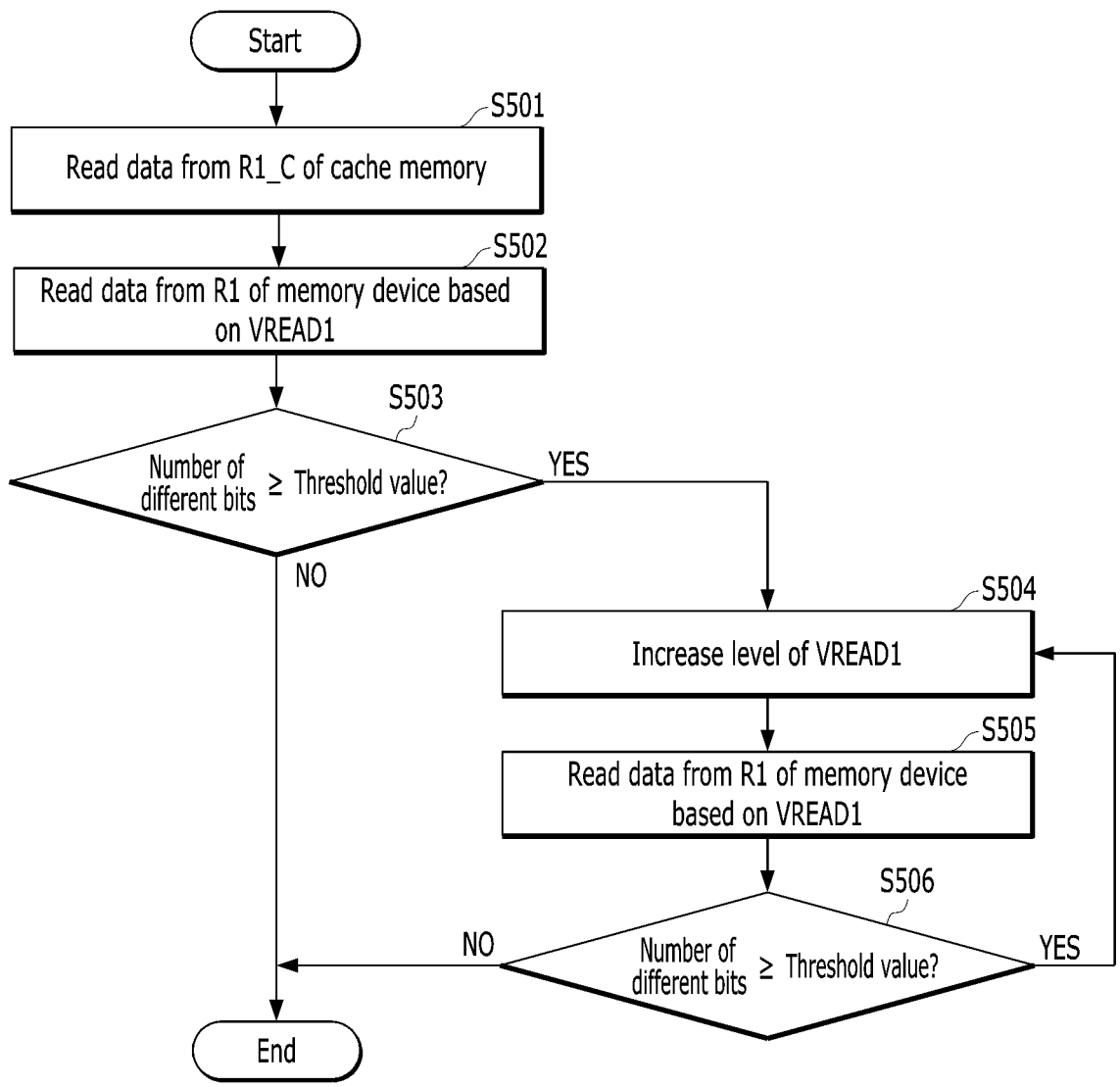
FIG. 5 is a flowchart illustrating a method for controlling a read voltage in a memory system in accordance with an embodiment of the present invention.

FIG. 5 is a flowchart illustrating a method for controlling a read voltage in a memory system, for example, the read voltage VREAD1 in the memory system 400 in accordance with a first embodiment of the present invention. The method of FIG. 5 may be performed periodically or it may be performed whenever a predetermined condition is fulfilled.

First of all, a cached data may be read from the region R1_C of the cache memory 414 in step S501. In step S502, a data corresponding to the cached data, which is the same data as the cached data, may be read from the region R1 of the memory device 420. The read voltage VREAD1 may be used in the read operation of the step S502.

The read voltage controller 415 may compare the data of the cache memory 414 that is read in the step S501 with the data of the memory device 420 that is read in the step S502, and determine whether the number of bits that are different between the two data is equal to or greater than a threshold value in step S503. Herein, the threshold value may be set based on the number of bits that are error-correctable. For example, if it is possible to error-correct two bits, the threshold value may be set to 2 or 3. Also, the threshold value may be set to 1 in order not to allow any error.

When it is determined in the step S503 that the number of different bits is less than the threshold value (see 'NO' in the step S503), it does not have to control the level of the read voltage VREAD1 and the process of controlling the read voltage VREAD1 may end.

When it is determined in the step S503 that the number of different bits is equal to or greater than the threshold value (see 'YES' in the step S503), the level of the read voltage VREAD1 may be controlled to be greater than before in step S504. In the step S504, the read voltage controller 415 may transfer a command CMD and an address ADD for increasing the level of the read voltage VREAD1 to the memory device 420 through the memory interface 416, and the read voltage generation circuit 423 of the memory device 420 may increase the level of the read voltage VREAD1 in response to the command CMD and the address ADD.

In step S505, a data corresponding to the cached data may be read again from the region R1 of the memory device 420 by using the read voltage VREAD1 that is increased in the step S504.

The read voltage controller 415 may compare the data of the cache memory 414 that is read in the step S501 with the data that is read again in the step S505 and determine whether or not the number of different bits between the two data is equal to or greater than a threshold value in step S506.

When it is determined in step S506 that the number of different bits is less than the threshold value (see 'NO' of the step S506), the process of controlling the read voltage VREAD1 may end. When it is determined in step S506 that the number of different bits is equal to or greater than the threshold value (see 'YES' of the step S506), the operations of the steps S504 to S506 may be repeated.

The level of the read voltage VREAD1 may be controlled to be increased until the number of different bits is less than the threshold value.

According to the method for controlling the read voltage VREAD1 of FIG. 5, the level of the read voltage VREAD1 may be increased until the number of different bits between the data cached in the cache memory 414 and the data that is read from the memory device 420 becomes less than the threshold value. The controlling method may be appropriate for a memory device having a tendency in which the read voltage is increased as time passes, for example, a PCRAM.

Although the method for controlling the read voltage VREAD1 is described in FIG. 5, the read voltages VREAD2 to VREAD4 may be controlled in the same manner that the read voltage VREAD1 is controlled.

Figure 6:
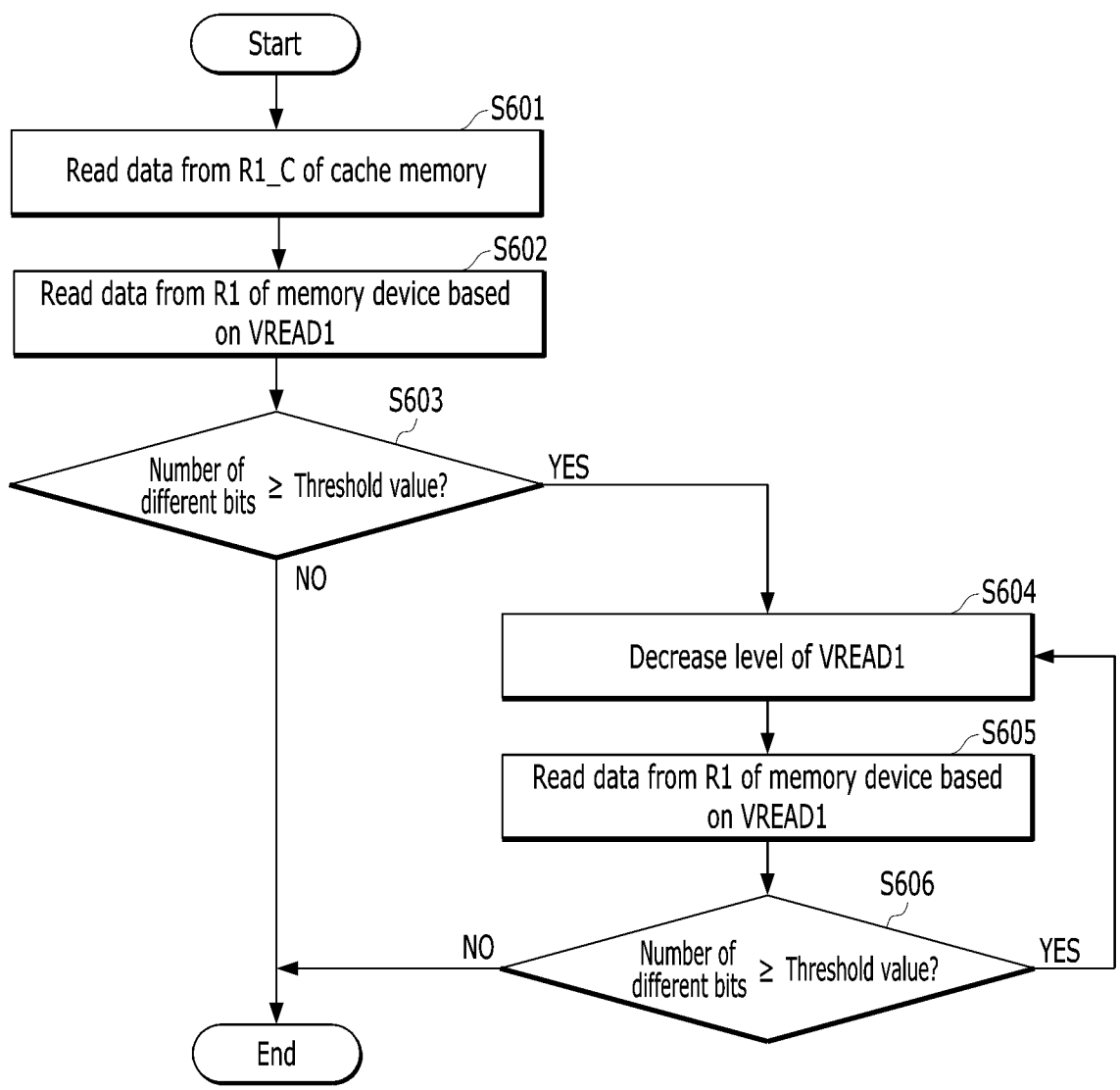
FIG. 6 is a flowchart illustrating a method for controlling a read voltage in a memory system in accordance with an embodiment of the present invention.

FIG. 6 is a flowchart illustrating a method for controlling a read voltage in a memory system, for example, a read voltage VREAD1 in the memory system 400 in accordance with an embodiment of the present invention. The method of FIG. 6 may be performed periodically or it may be performed whenever a predetermined condition is fulfilled.

Initially, a cached data may be read from the region R1_C of the cache memory 414 in step S601. In step S602, a data corresponding to the cached data, which is the same data as the cached data, may be read from the region R1 of the memory device 420. The read voltage VREAD1 may be used in the read operation of the step S602.

The read voltage controller 415 may compare the data of the cache memory 414 that is read in the step S601 with the data of the memory device 420 that is read in the step S602, and determine whether the number of bits that are different between the two data is equal to or greater than a threshold value in step S603. Herein, the threshold value may be set based on the number of bits that are error-correctable. For example, if it is possible to error-correct two bits, the threshold value may be set to 2 or 3. Also, the threshold value may be set to 1 in order not to allow any error.

When it is determined in the step S603 that the number of different bits is less than the threshold value (see 'NO' in the step S603), it does not have to control the level of the read voltage VREAD1 and the process of controlling the read voltage VREAD1 may end.

When it is determined in the step S603 that the number of different bits is equal to or greater than the threshold value (see 'YES' in the step S603), the level of the read voltage VREAD1 may be controlled to be less than before in step S604. In the step S604, the read voltage controller 415 may transfer a command CMD and an address ADD for decreasing the level of the read voltage VREAD1 to the memory device 420 through the memory interface 416, and the read voltage generation circuit 423 of the memory device 420 may decrease the level of the read voltage VREAD1 in response to the command CMD and the address ADD.

In step S605, a data corresponding to the cached data may be read again from the region R1 of the memory device 420 by using the read voltage VREAD1 that is decreased in the step S604.

The read voltage controller 415 may compare the data of the cache memory 414 that is read in the step S601 with the data that is read in the step S605 again and determine whether the number of different bits between the two data is equal to or greater than a threshold value or not in step S606.

When it is decided in step S606 that the number of different bits is less than the threshold value (see 'NO' of the step S606), the process of controlling the read voltage VREAD1 may end. When it is determined in step S606 that the number of different bits is equal to or greater than the threshold value (see 'YES' of the step S606), the operations of the steps S604 to S606 may be repeated.

The level of the read voltage VREAD1 may be controlled to be decreased until the number of different bits is less than the threshold value.

According to the method for controlling the read voltage VREAD1 of FIG. 6, the level of the read voltage VREAD1 may be decreased until the number of different bits between the data cached in the cache memory 414 and the data that is read from the memory device 420 becomes less than the threshold value. The controlling method may be appropriate for a memory device having a tendency in which the read voltage is decreased as time passes.

Although the method for controlling the read voltage VREAD1 is described in FIG. 6, the read voltages VREAD2 to VREAD4 may be controlled in the same manner that the read voltage VREAD1 is controlled.

Figure 7:
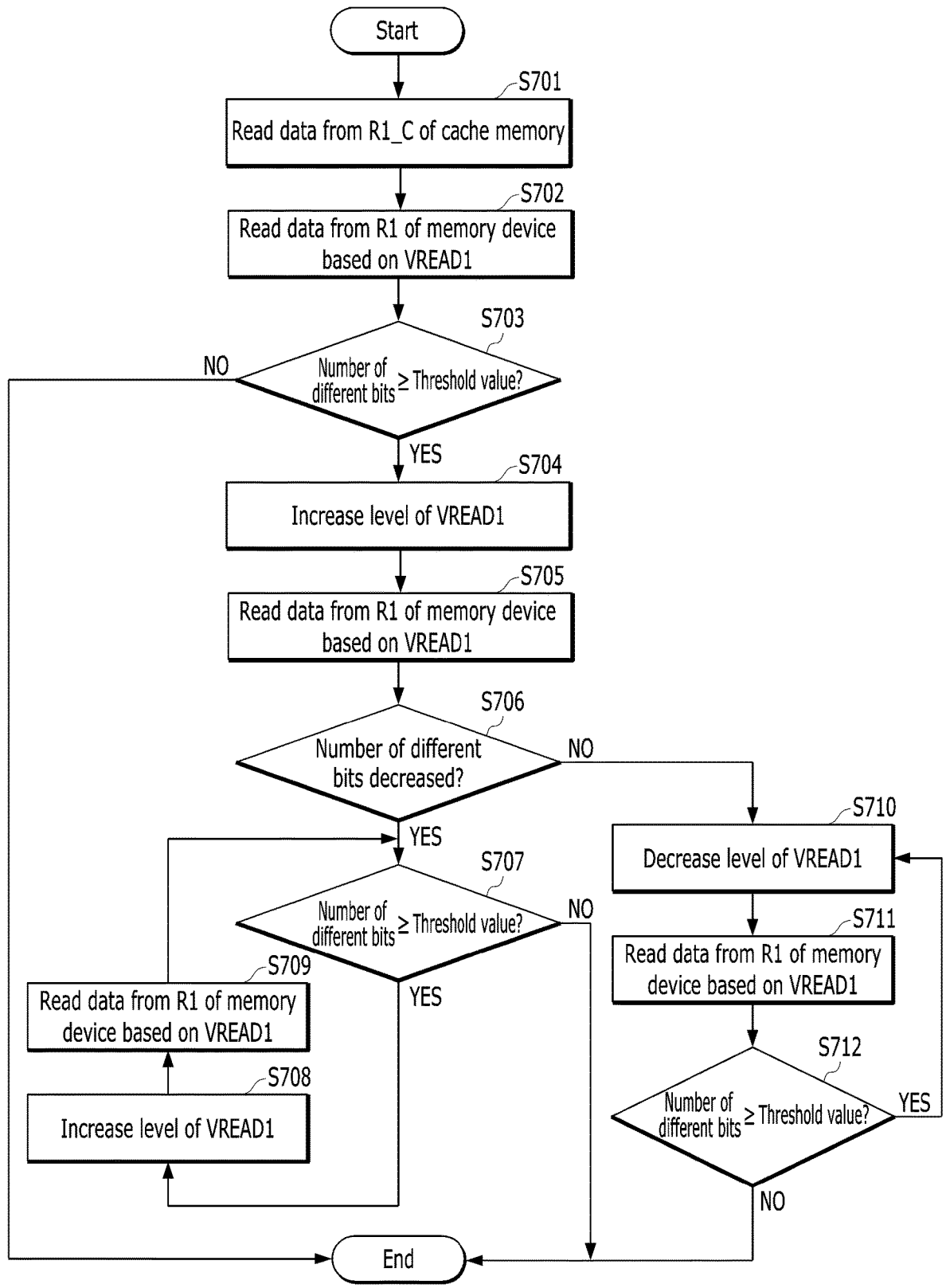
FIG. 7 is a flowchart illustrating a method for controlling a read voltage in a memory system in accordance with an embodiment of the present invention.

FIG. 7 is a flowchart illustrating a method for controlling a read voltage in a memory system, for example, the read voltage VREAD1 in the memory system 400 in accordance with an embodiment of the present invention. The method of FIG. 7 may be performed periodically or it may be performed whenever a predetermined condition is fulfilled.

Initially, a cached data may be read from the region R1_C of the cache memory 414 in step S701. In step S702, a data corresponding to the cached data, which is the same data as the cached data, may be read from the region R1 of the memory device 420. The read voltage VREAD1 may be used in the read operation of the step S702.

The read voltage controller 415 may compare the data of the cache memory 414 that is read in the step S701 with the data of the memory device 420 that is read in the step S702, and determine whether the number of bits that are different between the two data is equal to or greater than a threshold value in step S703. Herein, the threshold value may be set based on the number of bits that are error-correctable. For example, if it is possible to error-correct two bits, the threshold value may be set to 2 or 3. Also, the threshold value may be set to 1 in order not to allow any error.

When it is determined in the step S703 that the number of different bits is less than the threshold value (see 'NO' in the step S703), it does not have to control the level of the read voltage VREAD1 and the process of controlling the read voltage VREAD1 may end.

When it is determined in the step S703 that the number of different bits is equal to or greater than the threshold value (see 'YES' in the step S703), the level of the read voltage VREAD1 may be controlled to be greater than before in step S704. In the step S704, the read voltage controller 415 may transfer a command CMD and an address ADD for increasing the level of the read voltage VREAD1 to the memory device 420 through the memory interface 416, and the read voltage generation circuit 423 of the memory device 420 may increase the level of the read voltage VREAD1 in response to the command CMD and the address ADD.

In step S705, a data corresponding to the cached data may be read again from the region R1 of the memory device 420 by using the read voltage VREAD1 that is increased in the step S704.

The read voltage controller 415 may compare the data of the cache memory 414 that is read in the step S701 with the data of the memory device 420 that is read in the step S705 and determine whether the number of different bits between the two data is decreased less than the number of different bits in the step S703 in step S706. The operation of the step S706 may be performed in order to determine whether the level of the read voltage VREAD1 has to be increased or decreased.

When it is determined in step S706 that the number of different bits is decreased (see 'YES' of the step S706), it may be determined in step S707 whether the number of different bits is equal to or greater than the threshold value or not.

When it is determined in step S707 that the number of different bits is less than the threshold value (see 'NO' of the step S707), the process of controlling the read voltage VREAD1 may end since it does not have to control the level of the read voltage VREAD1 anymore.

When it is determined in step S707 that the number of different bits is equal to or greater than the threshold value (see 'YES' of the step S707), the level of the read voltage VREAD1 may be increased again in step S708, and then a data corresponding to the cached data may be read again from the region R1 of the memory device 420 in step S709 by using the read voltage VREAD1 which is increased again, and it may be determined again whether or not the number of different bits is equal to or greater than the threshold value in step S707. The level of the read voltage VREAD1 may be increased until the number of different bits becomes less than the threshold value by repeatedly performing the operations of the steps S707, S708 and S709.

When the number of different bits is not decreased in the step S706 (see 'NO' of the step S706), it may be determined that the level of the read voltage VREAD1 has to be decreased, instead of being increased. Therefore, the level of the read voltage VREAD1 may be decreased in step S710. In step S711, a data corresponding to the cached data may be read again from the region R1 of the memory device 420 by using the read voltage VREAD1 which is decreased in the step S710, and it may be determined again whether or not the number of different bits is equal to or greater than the threshold value in step S712. The level of the read voltage VREAD1 may be decreased until the number of different bits becomes less than the threshold value by repeatedly performing the operations of the steps S710, S711 and S712.

According to the method for controlling the read voltage VREAD1 of FIG. 7, the level of the read voltage VREAD1 may be increased or decreased until the number of different bits between the data cached in the cache memory 414 and the data that is read from the memory device 420 becomes less than the threshold value. The controlling method may be appropriate for a memory device having a tendency in which the read voltage is increased or decreased as time passes.

In the embodiment of FIG. 7, the method for increasing the read voltage VREAD1 or decreasing the read voltage VREAD1 according to a result showing whether or not the number of different bits is decreased after presenting the read voltage VREAD1 in advance. However, it is obvious to those skilled in the art that it is possible to continuously decrease the read voltage VREAD1 or increase the read voltage VREAD1 according to a result showing whether or not the number of different bits is decreased after dropping the read voltage VREAD1.

Although the method for controlling the read voltage VREAD1 is described in FIG. 7, the read voltages VREAD2 to VREAD4 may be controlled in the same manner that the read voltage VREAD1 is controlled.

According to the embodiments of the present disclosure, the read voltage used for a read operation of a memory device may be adjusted into an optimal value.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
   a memory device including a cell array and a read and write circuit suitable for reading and writing data from and to the cell array; and
   a memory controller including:
      a cache memory suitable for caching a portion of a-data stored in the memory device; and
      a read voltage controller suitable for controlling a level of a read voltage used for a read operation of the memory device by comparing cache data cached in the cache memory with data corresponding to the cache data, read from the cell array through the read and write circuit,
      wherein the cache data is data formerly read from the cell array and the data corresponding to the cache data is data newly read from the cell array.

2. The memory system of claim 1, wherein the read voltage controller controls the level of the read voltage based on the number of different bits between the cache data and the data read from the cell array.

3. The memory system of claim 2, wherein the read voltage controller controls the level of the read voltage in such a manner that the number of the different bits is decreased.

4. The memory system of claim 1, wherein the memory controller further includes:
   a host interface suitable for communicating with a host;
   a scheduler suitable for determining a process order of requests received from the host;
   a command generator suitable for generating a command to be applied to the memory device; and
   a memory interface suitable for communicating with the memory device.

5. A method for operating a memory system, comprising:
   reading a cached data from a cache memory included in a memory controller;
   reading data corresponding to the cached data from a cell array of a memory device through a read and write circuit of the memory device;
   comparing the cached data with the data read from the cell array; and
   determining a level of a read voltage used for a read operation of the memory device based on the comparison result,
   wherein the cached data is data formerly read from the cell array and the data corresponding to the cache data is data newly read from the cell array.

6. The method of claim 5, wherein the determining of the level of the read voltage of the memory device based on the comparison result includes:
   determining whether or not the number of different bits between the cached data and the data read from the cell array is equal to or greater than a threshold value; and
   when it is determined that the number of the different bits between the cached data and the data read from the cell array is equal to or greater than the threshold value, controlling the level of the read voltage.

7. The method of claim 6, wherein the controlling of the level of the read voltage includes
   increasing or decreasing the level of the read voltage such that the number of the different bits is made to be less than the threshold value.

8. The method of claim 6, wherein the controlling of the level of the read voltage includes:
   increasing the level of the read voltage;
   re-reading the data from the cell array by using the read voltage whose level is increased;
   re-checking whether or not the number of the different bits is less than the threshold value; and
   when the number of the different bits is equal to or greater than the threshold value, repeatedly performing the increasing of the level of the read voltage, the re-reading of the data from the cell array, and the re-checking of whether or not the number of the different bits is less than the threshold value.

9. The method of claim 6, wherein the controlling of the level of the read voltage includes:
   decreasing the level of the read voltage;
   re-reading the data from the cell array by using the read voltage level which is decreased;
   re-checking whether or not the number of the different bits is less than the threshold value; and
   when the number of the different bits is equal to or greater than the threshold value, repeatedly performing the decreasing of the level of the read voltage, the re-reading of the data from the cell array corresponding to the cached data from the memory device, and the re-checking of whether or not the number of the different bits is less than the threshold value.

10. The method of claim 6, wherein the controlling of the level of the read voltage includes:
    increasing the level of the read voltage;
    re-reading the data corresponding to the cached data from the cell array by using the read voltage level which is increased;
    checking whether or not the number of the different bits is decreased; and
    when the number of the different bits is decreased, increasing the level of the read voltage until the number of the different bits becomes less than the threshold value.

11. The method of claim 10, wherein the controlling of the level of the read voltage further includes:
    when the number of the different bits is not decreased, decreasing the level of the read voltage until the number of the different bits becomes less than the threshold value.

12. The method of claim 6, wherein the controlling of the level of the read voltage includes:
    decreasing the level of the read voltage;
    re-reading the data from the cell array by using the read voltage level which is decreased;
    checking whether or not the number of the different bits is decreased; and
    when the number of the different bits is decreased, decreasing the level of the read voltage until the number of the different bits becomes less than the threshold value.

13. The method of claim 12, wherein the controlling of the level of the read voltage further includes:
    when the number of the different bits is not decreased, increasing the level of the read voltage until the number of the different bits becomes less than the threshold value.

14. A memory system, comprising:
    a memory device including a cell array and a read and write circuit suitable for reading and writing data from and to the cell array, the cell array including a plurality of regions; and a memory controller including:
- a cache memory suitable for caching a portion of data stored in each of the plurality of the regions of the memory device; and
- a read voltage controller suitable for controlling a level of a read voltage used for a read operation on each of the plurality of the regions by comparing cache data corresponding to each of the plurality of regions, cached in the cache memory with a portion of data corresponding to the cache data, read from each of the plurality of the regions in the cell array through the read and write circuit,
- wherein the cache data is data formerly read from the cell array and the data correspond to the cache data is data newly read from the cell array.

* * * * *